United States Patent [19]

Kim et al.

[11] Patent Number: 5,514,611
[45] Date of Patent: May 7, 1996

[54] METHOD OF MANUFACTURING A SEMICONDUCTOR MEMORY DEVICE HAVING A READ-ONLY MEMORY CELL

[75] Inventors: Sei-jin Kim, Suwon; Hyung-bok Kim, Seoul, both of Rep. of Korea

[73] Assignee: Samsung Electronics Co., Ltd., Suwon, Rep. of Korea

[21] Appl. No.: 281,003

[22] Filed: Jul. 27, 1994

Related U.S. Application Data

[62] Division of Ser. No. 132,960, Oct. 7, 1993, Pat. No. 5,396,098.

[30] Foreign Application Priority Data

Oct. 7, 1992 [KR] Rep. of Korea .................. 92-18408

[51] Int. Cl.⁶ ............................................... H01L 21/265
[52] U.S. Cl. .............................. 437/48; 437/44; 437/52
[58] Field of Search ............................ 437/44, 47–48, 437/52, 919, 60, 45; 257/390–392

[56] References Cited

U.S. PATENT DOCUMENTS

| | | | |
|---|---|---|---|
| 4,672,419 | 6/1987 | McDavid | 257/408 |
| 4,728,617 | 3/1988 | Woo et al. | 257/408 |
| 4,746,624 | 5/1988 | Cham et al. | 257/408 |
| 5,340,760 | 8/1994 | Komori et al. | 437/52 |

*Primary Examiner*—George Fourson
*Assistant Examiner*—H. Jey Tsai
*Attorney, Agent, or Firm*—Cushman Darby & Cushman

[57] ABSTRACT

In a semiconductor memory device, and in particular in a NAND-type ROM memory cell, the transistors of a memory cell region and a peripheral circuit portion are manufactured to include a first and second impurity regions. The second impurity region has a higher impurity density impurity than the first impurity region. A third impurity region is added which has a higher impurity density and shallower depth than the impurity density of the first impurity region. Accordingly, the conventional transistor structure of the peripheral circuit portion is maintained while the transistors of the memory cell are optimized to have ideal electrical characteristics, including an increased current driving capability.

5 Claims, 4 Drawing Sheets

PERIPHERAL    MEMORY CELL

METHOD OF MANUFACTURING A SEMICONDUCTOR MEMORY DEVICE HAVING A READ-ONLY MEMORY CELL

This is a division of application Ser. No. 08/132,960, filed Oct. 7, 1993 now U.S. Pat. No. 5,396,098.

FIELD OF THE INVENTION

The present invention relates to the structure of a semiconductor memory device. In particular, it relates to a NAND-type structure of a read-only-memory (ROM) cell.

BACKGROUND OF THE INVENTION

Conventional ROMs, such as 4 Mb and 16 Mb mask ROMs, utilize a NAND-type memory cell structure which allows for high integration. FIG. 1 shows a circuit diagram of a NAND-type mask ROM cell.

A conventional NAND-type mask ROM cell has string lines such as are indicated in FIG. 1 by R1 and R2. String line R1 is made up of string select transistors M1 and M3, and string line R2 is made up of string select transistors M2 and M4. Transistors M1 and M2 are driven by string select line S1, while cell transistors M3 and M4 are driven by string select line S2.

The cell transistors M1, M3, M5, M7, M9 . . . , Mn–1 are serially connected to constitute string line R1, and cell transistors M2, M4, M6, M8, M10 . . . , Mn are serially connected to constitute string line R2.

A bit line is formed by the parallel connection of string lines R1 and R2. Thus, the basic unit of a memory cell array is formed.

Enhancement-type and depletion-type transistors are shown, with the latter being designated by a reference symbol D. Depletion-type transistors are turned on when the voltage of the gate is less than the transistor's threshold voltage, while enhancement-type transistors are turned on when the voltage of the gate is higher than the transistor's threshold voltage. When a transistor is turned off, appreciable current does not flow through it.

For the selection of a particular memory cell, word lines W1, W2, W3 . . . , Wn are driven by voltage sources at a level of Vcc or 0 volts (not shown).

The operation of the conventional NAND-type mask ROM cell will now be described. When the memory cell is in standby mode, a zero voltage, or logic low, is applied to both string selection lines S1 and S2, which thereby floats the bit line because transistors M3 and M2 are turned off. During a read operation, string line R1 may be selected by driving string selection line S2 with the voltage source Vcc (not shown), or a logic high signal, while driving the other string selection line S1 with zero volts.

The cell transistor of string line R1 designated "a" in FIG. 1 is selected when string selection line S1 is driven at a logic low, string selection line S2 is driven at a logic high, word line W2 is driven at a low logic level, and the remaining word lines are driven at a high logic level. Thus, cell transistor "a" is turned off because word line W2 is at a voltage which is below the threshold voltage of an enhancement-mode transistor. The gate voltage of the non-selected cell transistors are higher than the threshold voltage, so the non-selected transistors are turned on because the word lines are being driven at a voltage which is above the threshold voltage level of the enhancement-mode transistor. Thus, whether or not current will flow on the bit line is determined by the level of the voltage at the gate of the selected cell transistor.

Metal oxide semiconductor (MOS) transistors having lightly doped drain (LDD) structure or double diffused drain (DDD) structure are typically used for improved electrical characteristics and reliability in the conventional NAND-type mask ROM. The use of LDD and DDD transistors also allows for the increased integration of the devices.

The source and drain regions of transistors with LDD and DDD structures are formed with low density impurity regions creating a high breakdown voltage and efficiently suppressing the generation of hot-carriers. The low density region together with the channel region bear the voltage drop in the horizontal direction across the channel. The low density impurity regions reduce the maximum value of the electric field in the horizontal direction across the channel, thereby considerably preventing impact ionization which occurs in the vicinity of the drain region. However, the low density impurity region shortens the length of the channel.

When the density of the impurities in the low density region is lowered, the series resistance is increased, which reduces the current driving capability of the device. On the other hand, if the impurity density of the low density region is increased to increase the current driving capability, the horizontal electric field of the channel is increased. Either an increase in series resistance or an increase in the horizontal electric field of the channel reduces the reliability of the device because of the increase in the generation of hot carriers.

FIGS. 2 through 6 are cross-sectional views for explaining a manufacturing method of a conventional transistor having the LDD structure.

A gate oxide film 12 is formed on a P-type semiconductor substrate 11. Then, a polycrystalline silicon (polysilicon) layer is deposited on the gate oxide film 12. A gate electrode 13 is formed by patterning the deposited polysilicon layer using a photo-etching process. Phosphorous 14 is subsequently ion-implanted on the entire surface.

Low density source and drain regions $n^-$ are formed. An oxide film is deposited on the entire surface of the resultant material, which is then anisotropically etched to form sidewall spacers 15 on the side surfaces of the gate electrode 13.

Arsenic 16 is then ion-implanted on the entire surface.

High density source and a drain regions $n^+$ are then formed, completing the transistor with the LDD structure.

The conventional memory cell uses identically formed transistors with an LDD or a DDD structure in both the the memory cell as well as in the peripheral circuitry. The conventional LDD or DDD transistor suppresses the generation of hot-carriers, however the current driving capability of the device is reduced because of the increased resistance of the low density regions $n^-$.

Thus, hot-carrier generation is suppressed in the peripheral circuitry, however the memory cell transistor which has less of a problem with hot-carrier generation has its current driving capability reduced because of the increased resistance of the low density $n^-$ region.

The size of the conventional LDD or DDD transistor is influenced by the width of the gate electrode and the sidewall spacer. Therefore, if the current driving capacity of the memory cell transistor is increased by reducing the width of the gate electrode or the sidewall spacer, the punch-through voltage of the peripheral transistor is reduced, worsening the electrical characteristics of the device. Also, if the width of the gate electrode across the channel is reduced in the conventional LDD or DDD memory cell transistor to increase the current capacity, a delay is generated in the device due to the increase of the word line resistance, resulting in slower transition speeds.

SUMMARY OF THE INVENTION

A litography process is described which provides for a high density $N^+$ source and drain region to be added to the transistors of a memory cell region of a NAND-type mask ROM cell. The current driving capability of the cell transistor is thereby increased, while the electrical characteristics of the transistors in the peripheral circuit region remain unaffected.

As will be illustrated by the embodiment to be described, the invention provides for a memory device having a transistor memory cell source and drain region structure in which a first impurity region is disposed closer to the center of the gate electrode and channel region below the gate than an adjacent high density second impurity region. A high density third impurity region is shallowly formed within the first impurity region to result in an $n^-/N^+/n^+$ configuration for the source and drain of the memory cell transistors.

The transistor of the peripheral circuit region of the device has a DDD structure in which the first impurity region is formed to surround the high density second impurity region, or has an LDD structure in which the first impurity region is more expanded toward the other side of the gate electrode, than does the high density second impurity region.

BRIEF DESCRIPTION OF THE DRAWINGS

The above objects and other advantages of the present invention will become more apparent from the detailed description of a preferred embodiment of the present invention with reference to the attached drawings in which.

DESCRIPTION OF PREFERRED EMBODIMENTS

A preferred embodiment of the present invention will now be described in detail, with reference to the attached drawings.

Figure 1:
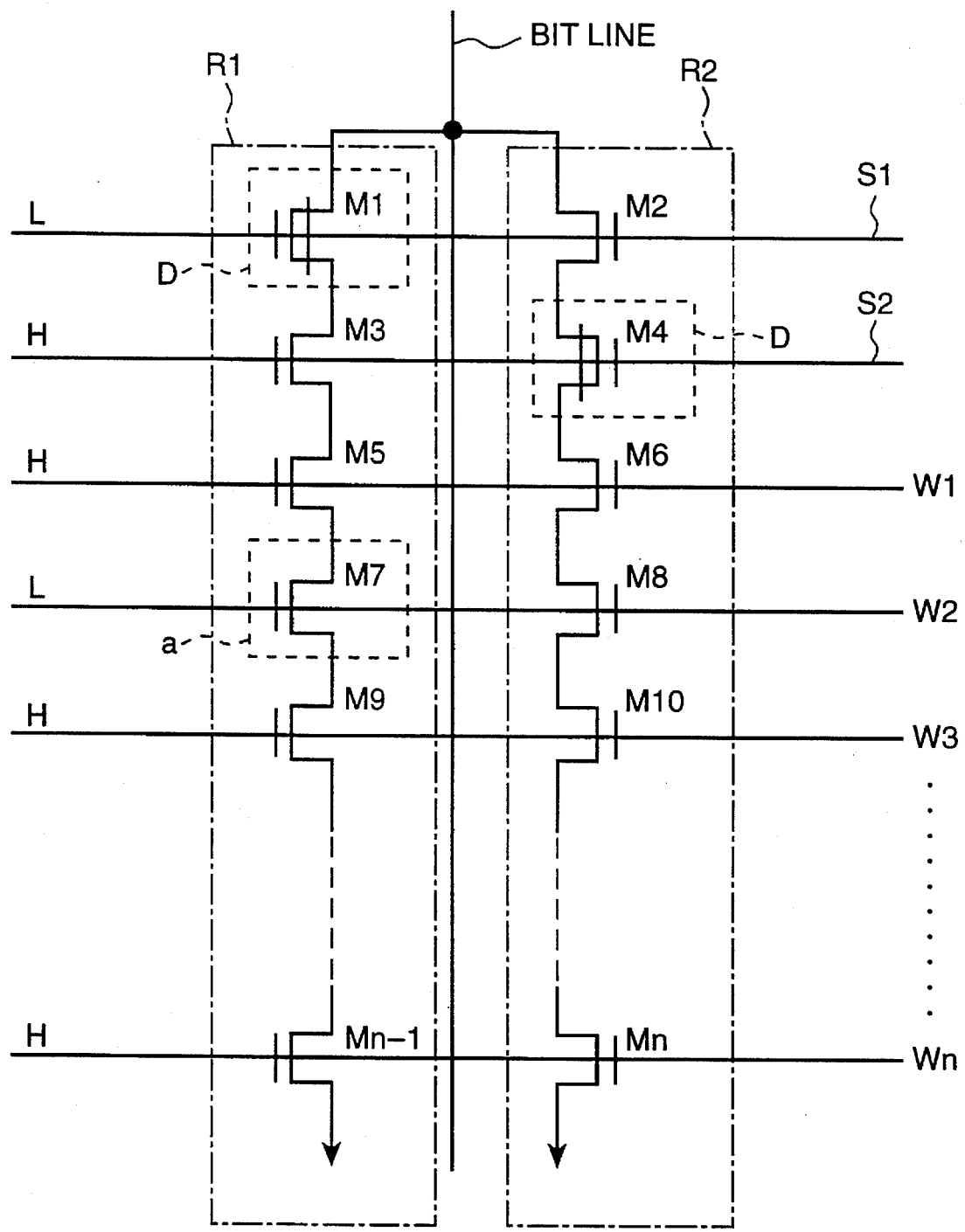
FIG. 1 is a circuit diagram of the conventional NAND-type mask ROM cell.
Figure 2:
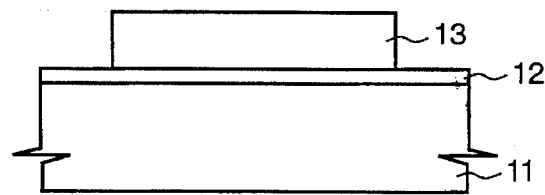
FIGS. 2 through 6 are cross-sectional views of a manufacturing method of the semiconductor memory device according to the conventional method.
Figure 3:
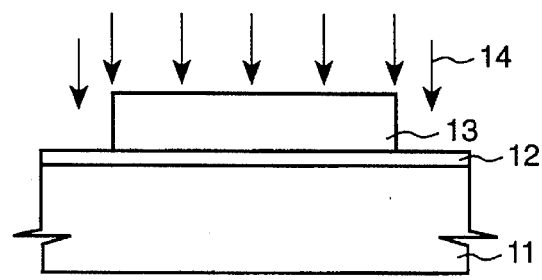
Figure 4:
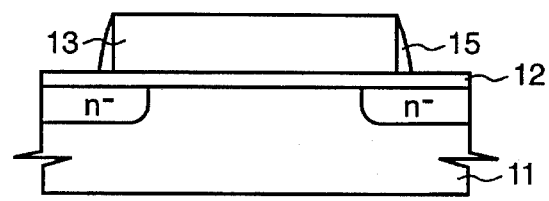
Figure 5:
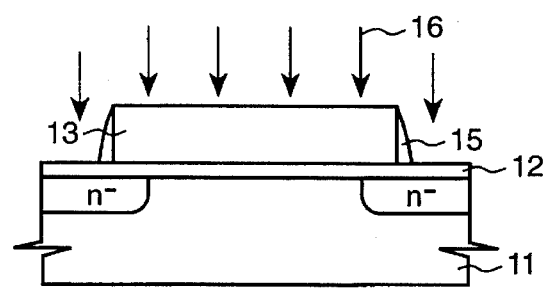
Figure 6:
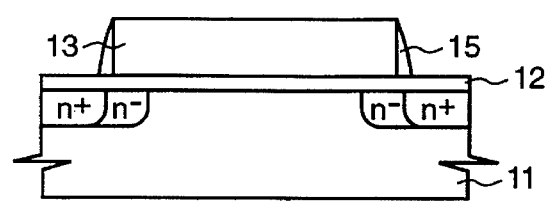
Figure 7:
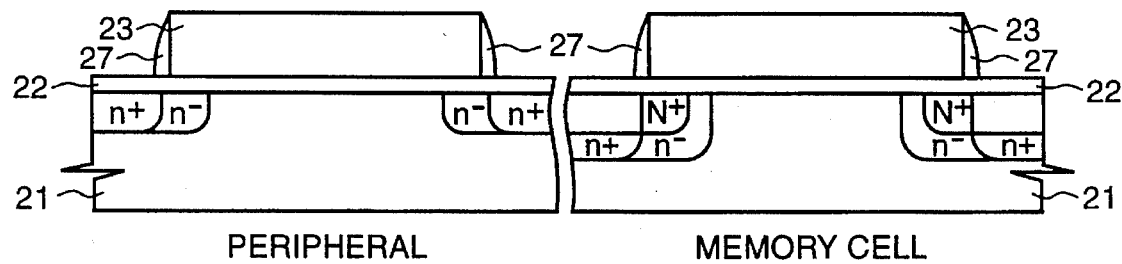
FIG. 7 is a cross-sectional view of a semiconductor memory device which is manufactured according to the present invention.

FIG. 7 shows the transistors of a peripheral circuit portion and a memory cell region of a NAND-type mask ROM cell. The transistors which are formed as the memory cell region and those which are formed as the peripheral circuit portion each have a gate electrode 23. The gate electrode 23 is formed with an interposing gate insulation film 22 between the gate electrode 23 and a P-type semiconductor substrate 21. Sidewall spacers 27 are then formed on the side surface of the gate electrode 23.

In the present preferred embodiment, the transistors of both the peripheral and memory cell regions have an LDD structure or a DDD structure in which low density $n^-$ and high density $n^+$ source/drain regions are sequentially formed in a surface of the substrate below the gate electrode 23, as shown in FIG. 7. The $n^-$ region is disposed closer to the center of the gate region and channel region than is the $n^+$ region. But in the transistor of the memory cell region, an additional high density $N^+$ region is shallowly formed within the low density $n^-$ region. This forms the source and drain regions $n^-/N^+/n^+$ as shown in FIG. 7.

FIGS. 8 through 12 show a method of manufacturing the transistors of the peripheral circuit portion and memory cell regions.

Figure 8:
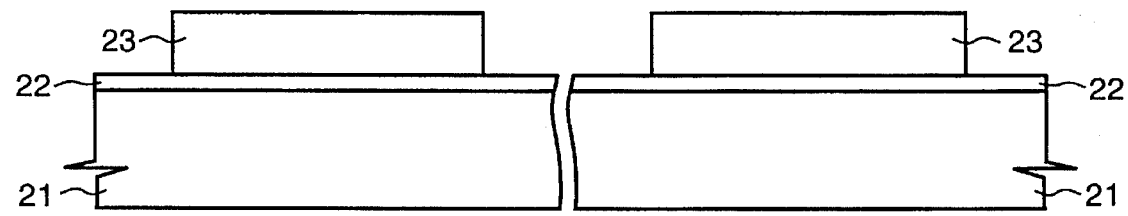
FIGS. 8 through 12 are cross-sectional views for explaining a manufacturing method of a semiconductor memory device according to a preferred embodiment of the present invention.

FIG. 8 shows the step of forming a gate electrode 23. A gate oxide film 22 is formed on the P-type semiconductor substrate 21 by thermal oxidation. Then a polysilicon layer and tungsten silicide $WSi_x$ layer are sequentially laminated on the gate oxide film 22 using a mask pattern for forming the gate electrode. This forms the polycide gate electrode 23 of polysilicon and tungsten silicide layers. Other layers forming the gate electrode 23 are possible, for instance the polysilicon layer can be deposited, and then $POCl_3$ can be deposited, or a polysilicon layer doped with impurities can be used.

Figure 9:
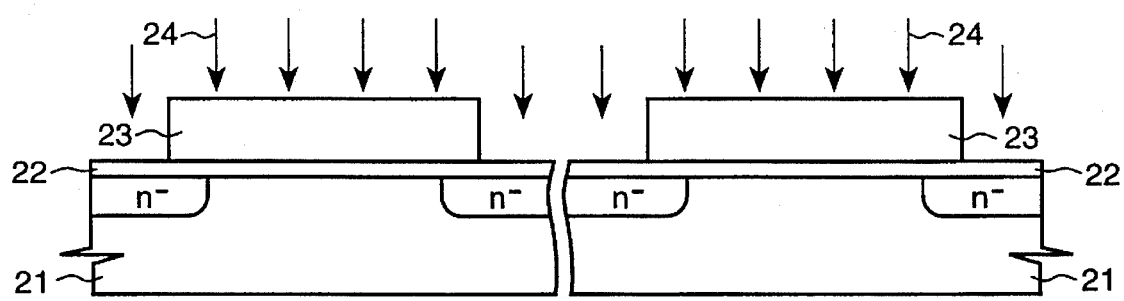

FIG. 9 shows the subsequent ion-implantation of an impurity 24, for example phosphorus of a dose of 3.2E13, onto the resultant surface at an energy level of 60 keV. This forms the low density $n^-$ source and drain regions.

Figure 10:
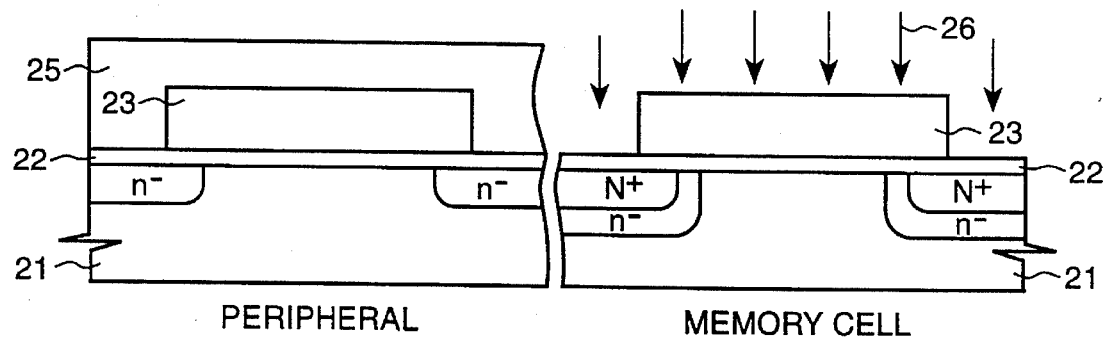

FIG. 10 shows the step of forming the high density $N^+$ source and drain regions in the transistors of the memory cell region. A photoresist (not shown) is coated on the entire surface of the resultant material. The photoresist 25 is patterned with a mask which exposes only the memory cell region. An impurity 26, for example arsenic of a dose of 2.5E15 at an energy of 40 keV, is then ion-implanted onto the exposed memory cell regions to form the high density $N^+$ source and drain regions. In the present embodiment it is desired that the high density $N^+$ source and drain regions are formed to have a lower density than the high density $n^+$ source and drain regions (formed in a subsequent process).

Since the high density $N^+$ source and drain regions are formed in the transistors of the memory cell regions only, the dose and energy of the impurity 26 can be adjusted without influencing the transistors of the peripheral circuit region. This allows for the optimization of the electrical characteristics of the memory device.

Figure 11:
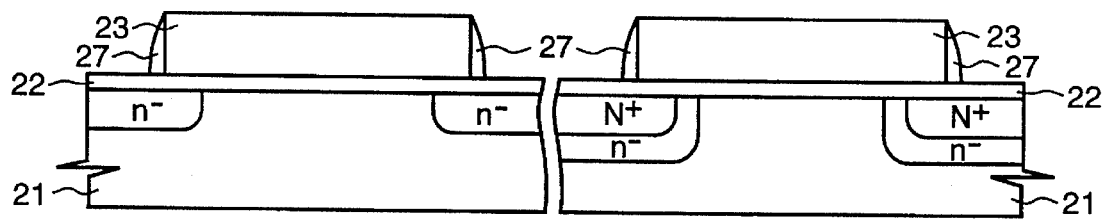

FIG. 11 shows the step of forming the sidewall spacers 27. After the photoresist pattern 25 is removed from the peripheral circuit region, an oxide film (not shown), is deposited. The deposited oxide film is then anisotropically etched to leave the sidewall spacers 27 on the sidewalls of the polycide gate electrode 23.

Figure 12:
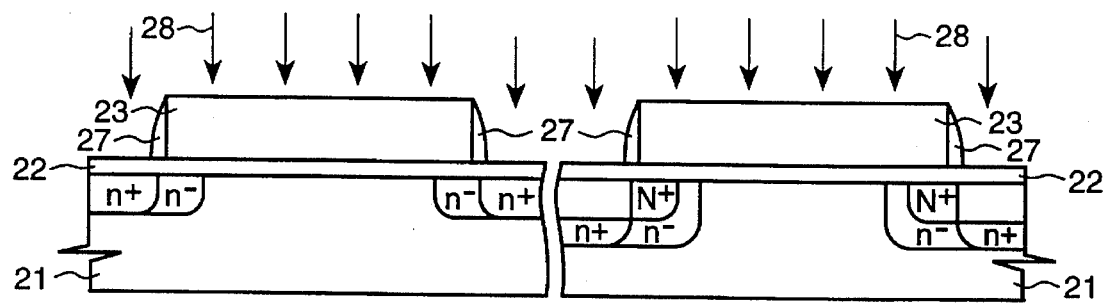

FIG. 12 shows the step of forming the high density $n^+$ source and drain regions. The entire surface of the resultant material on which sidewall spacer 27 was formed is ion-implanted by, for example, arsenic 28 of a dose of 5.0E15 and an energy of 40 keV. This forms the high density $n^+$ source and drain regions, thereby completing the transistor structure of the peripheral circuit and memory cell regions of the memory device.

COMPARATIVE TESTS

Table 1 compares the electrical characteristics of cell transistors which are manufactured by the conventional method against those manufactured according to the embodiment of this invention described with reference to FIGS. 8 through 12. The cell transistor compared is an enhancement transistor whose width is 0.8 μm and length is 0.65 μm. The transistors of the peripheral circuit regions for the present invention and the conventional device are both manufactured using the same manufacturing process. This is to ensure that the electrical characteristics of the peripheral circuit region remain constant for the comparison of Table 1.

TABLE 1

|  | Vt | unit cell current | string cell current (on) | string cell leakage current (off) |
|---|---|---|---|---|
| conventional | 0.700 V | 326.9 μA | 31.3 μA | 3.4E 5 μA |
| present invention | 0.887 V | 374.2 μA | 38.9 μA | 2.9E 5 μA |
| improved effect |  | 17.5% increase | 24% increase | 14.7% decrease |

As shown in Table 1, the cell transistor manufactured by the present invention allows for greatly increased current, i.e., by 17.5% and 24%, as compared with the cell transistor manufactured by the conventional method. The leakage current is also decreased by 14.7%. Thus, NAND-type ROM cells manufactured according to the present invention have greatly improved electrical characteristics.

Cell transistors manufactured according to the conventional methods are affected by the width of the gate electrode and sidewall spacer, therefore the dispersal of current is increased over that for cell transistors manufactured according to the present invention, which are affected only by the width of the gate electrode. By adjusting the dose and the energy of the impurities which form the high density $N^+$ region, the characteristics of the memory cell transistor can be optimized without affecting the transistor of the peripheral circuit region.

Thus, according to the present invention, the transistors of a memory cell region and a peripheral circuit portion including a first impurity region and a second impurity region having the higher density impurity than the first impurity region are manufactured using a lithography process which forms an additional third impurity region which has a higher impurity density and shallower depth than the first impurity density in the first impurity region of the transistor in only the memory cell region. Accordingly, high reliability of the transistor of the peripheral circuit region is maintained and the current driving capability of the memory cell transistor is increased.

NAND-type ROM memory manufactured according to the present invention have reduced leakage current and current dispersal, and have improved electrical characteristics.

It is to be appreciated that the present invention is not to be construed as to be limited to the embodiments described. It is apparent that various modifications are possible by persons skilled in the art which are within the scope of the present invention.

What is claimed is:

1. A method of manufacturing a semiconductor memory device having a memory cell portion and a peripheral circuit portion on a semiconductor substrate of a first conductive type, said method comprising the steps of:

forming a gate insulation film on said semiconductor substrate;

forming a plurality of gate electrodes over respective channel regions of said memory cell portion and said peripheral circuit portion, by depositing a conductive material on said gate insulation film and patterning said deposited conductive material;

forming a first impurity region of a second conductive type having a first impurity density on opposite ends of said respective channel regions of said memory cell portion and said peripheral circuit portion, said first impurity region in said memory cell portion being formed to have a first junction depth equal to that of said first impurity region in said peripheral circuit portion;

exposing said memory cell portion by a lithography process;

forming a third impurity region having a third impurity density within said first impurity region formed in said memory cell portion by implanting an impurity ion of said second conductive type onto said exposed memory cell portion, said third impurity density being higher than said first impurity density, and said third impurity region being formed to have a second junction depth shallower than said first junction depth of said first impurity region;

forming a sidewall spacer on a side surface of said gate electrodes by depositing an insulation material, and then anisotropically etching said deposited insulation material; and forming a second impurity region having a second impurity density by implanting an impurity ion of said second conductive type into said semiconductor substrate, said second impurity density being higher than said first impurity density.

2. The method of manufacturing a semiconductor memory device according to claim 1, wherein said first impurity region is formed of phosphorus ions.

3. The method of manufacturing a semiconductor memory device according to claim 1, wherein said second impurity region and said third impurity regions are formed of arsenic ions.

4. The method of manufacturing a semiconductor memory device according to claim 1, wherein said second impurity density is higher than said third impurity density.

5. The method of manufacturing a semiconductor memory device according to claim 1, wherein said gate electrodes are formed of a polycide structure comprising a polysilicon layer and a tungsten silicide layer.

* * * * *